US010147907B2

(12) United States Patent
Wehlus et al.

(10) Patent No.: US 10,147,907 B2
(45) Date of Patent: Dec. 4, 2018

(54) ORGANIC LIGHT EMITTING COMPONENT WITH A PLURALITY OF NANOSTRUCTURES PROJECTING INTO AN EMITTER LAYER

(71) Applicant: OSRAM OLED GmbH, Regensburg (DE)

(72) Inventors: Thomas Wehlus, Lappersdorf (DE); Arne Fleißner, Regensburg (DE)

(73) Assignee: OSRAM OLED GmbH (DE)

( * ) Notice: Subject to any disclaimer, the term of this patent is extended or adjusted under 35 U.S.C. 154(b) by 32 days.

(21) Appl. No.: 15/501,485

(22) PCT Filed: Aug. 11, 2015

(86) PCT No.: PCT/EP2015/068467
§ 371 (c)(1),
(2) Date: Feb. 3, 2017

(87) PCT Pub. No.: WO2016/023903
PCT Pub. Date: Feb. 18, 2016

(65) Prior Publication Data
US 2017/0229678 A1    Aug. 10, 2017

(30) Foreign Application Priority Data
Aug. 11, 2014 (DE) .......................... 10 2014 111 424

(51) Int. Cl.
*H01L 29/08* (2006.01)
*H01L 21/00* (2006.01)
(Continued)

(52) U.S. Cl.
CPC .......... *H01L 51/5296* (2013.01); *H01L 51/56* (2013.01); *H01L 51/0026* (2013.01);
(Continued)

(58) Field of Classification Search
CPC . H01L 51/56; H01L 51/5056; H01L 51/5072; H01L 51/0048; H01L 51/5296
See application file for complete search history.

(56) References Cited

U.S. PATENT DOCUMENTS 7,608,856 B2  10/2009  Becker et al.
8,790,958 B2   7/2014  Cho et al.
(Continued)

FOREIGN PATENT DOCUMENTS

CN       1608328     4/2005
CN     101681999     3/2010
(Continued)

OTHER PUBLICATIONS

Guang Zhu et al., "Direct synthesis of straight SiO$_2$ nanorods," Symposia D, E and F from MRS International Materials Research Conference, Journal of Physics: Conference Series 152 (2009) 012013.
(Continued)

*Primary Examiner* — Alonzo Chambliss
(74) *Attorney, Agent, or Firm* — DLA Piper LLP (US)

(57) ABSTRACT

A light-emitting device includes a carrier, an organic layer sequence arranged on the carrier and having at least one emitter layer containing a light-emitting material configured to emit light of a first wavelength range, a first electrode and a second electrode, and a multiplicity of nanostructures, wherein the nanostructures have a refractive index smaller than a refractive index of the light-emitting material of the emitter layer and at least some of the nanostructures project into the emitter layer or pierce through the emitter layer.

15 Claims, 5 Drawing Sheets

(51) Int. Cl.
*H01L 51/52* (2006.01)
*H01L 51/56* (2006.01)
*H01L 51/00* (2006.01)
*H01L 51/50* (2006.01)

(52) U.S. Cl.
CPC ...... *H01L 51/0034* (2013.01); *H01L 51/5064* (2013.01); *H01L 51/5284* (2013.01); *H01L 2251/5369* (2013.01)

(56) References Cited

U.S. PATENT DOCUMENTS

| | | |
|---|---|---|
| 2005/0122035 A1 | 6/2005 | Birnstock et al. |
| 2008/0278063 A1 | 11/2008 | Cok |
| 2008/0297029 A1 | 12/2008 | Cok |
| 2010/0068171 A1 | 3/2010 | Guelcher et al. |
| 2012/0291862 A1* | 11/2012 | Jiawook ............ H01L 31/02168 136/255 |
| 2013/0248822 A1* | 9/2013 | Gong ................. H01L 51/4266 257/26 |
| 2013/0313514 A1* | 11/2013 | Hwang ................... H01L 33/16 257/13 |
| 2014/0061591 A1 | 3/2014 | Chichak et al. |
| 2014/0084243 A1* | 3/2014 | Zhu ........................ H01L 33/24 257/13 |
| 2014/0264316 A1 | 9/2014 | Setz et al. |
| 2016/0013366 A1* | 1/2016 | Hwang ................... H01L 33/24 257/13 |

FOREIGN PATENT DOCUMENTS

| | | |
|---|---|---|
| CN | 101711439 | 5/2010 |
| CN | 103931010 | 7/2014 |
| DE | 10 2008 010 031 A1 | 4/2009 |
| EP | 2 704 227 A2 | 3/2014 |
| WO | 2012/063171 A1 | 5/2012 |
| WO | 2013/068842 A1 | 5/2013 |
| WO | 2014/051900 A1 | 4/2014 |
| WO | 2015/082486 A1 | 6/2015 |

OTHER PUBLICATIONS

Minhua Cao et al., "Synthesis and characterization of $MgF_2$ and $KMgF_3$ nanorods," Journal of Solid State Chemistry, vol. 177, 2004, pp. 2205-2209.

* cited by examiner

ORGANIC LIGHT EMITTING COMPONENT WITH A PLURALITY OF NANOSTRUCTURES PROJECTING INTO AN EMITTER LAYER

TECHNICAL FIELD

This disclosure relates to an organic light-emitting device and a method of producing an organic light-emitting device.

BACKGROUND

In organic light-emitting diodes (OLEDs), only part of the generated light is outcoupled directly. The rest of the light generated in the active region is distributed among various loss channels, for instance in light which is guided in the substrate, in a transparent electrode and in organic layers by wave guidance effects, and in surface plasmons, which may be generated in a metallic electrode. The wave guidance effects arise in particular through the refractive index differences at the interfaces between the individual layers and regions of an OLED. With known OLEDs, typically only around a quarter of the light generated in the active region is outcoupled into the surrounding environment, i.e., for example, air while around 25% of the generated light is lost to emission by wave guidance in the substrate, around 20% of the generated light by wave guidance in a transparent electrode and the organic layers and around 30% through the generation of surface plasmons in a metallic electrode.

The organic semiconductor materials used in the organic light-emitting diodes have a refractive index in the range of for instance n~1.8. Because of that relatively high refractive index, a major part of the light generated does not leave the organic layer stack due to total reflection at the interfaces with material layers with a lower refractive index (for example, the substrate glass with n~1.5 or air with n~1), thereby impairing the efficiency of the devices.

Methods of providing organic semiconductor materials with a reduced refractive index are known. It is known, for example, to modify the chemical structure of individual organic semiconductor materials such that the refractive index is decreased, or to use specific individual materials with a low refractive index. However, the known measures are limited to the use of those materials in an individual charge transport layer in the organic layer stack. Moreover, there are limits to reduction of the refractive index of the organic semiconducting materials by chemical modification.

It could therefore be helpful to provide an organic light-emitting device with efficient light outcoupling. In particular, it could be helpful to appropriately decrease the refractive index within the organic layer sequence.

SUMMARY

We provide a light-emitting device including a carrier, an organic layer sequence arranged on the carrier and having at least one emitter layer containing a light-emitting material configured to emit light of a first wavelength range, a first electrode and a second electrode, and a multiplicity of nanostructures, wherein the nanostructures have a refractive index smaller than a refractive index of the light-emitting material of the emitter layer and at least some of the nanostructures project into the emitter layer or pierce through the emitter layer.

We also provide a method of producing a light-emitting device, the device including a carrier, an organic layer sequence arranged on the carrier and having at least one emitter layer containing a light-emitting material configured to emit light of a first wavelength range, a first electrode and a second electrode, and a multiplicity of nanostructures, wherein the nanostructures have a refractive index smaller than a refractive index of the light-emitting material of the emitter layer and at least some of the nanostructures project into the emitter layer or pierce through the emitter layer, the method including a) providing the carrier, b) forming the first electrode on the carrier, c) forming the multiplicity of nanostructures on the first electrode, forming the organic layer sequence at least in the regions between the nanostructures, and forming the second electrode on the organic layer sequence.

DETAILED DESCRIPTION

Our organic light-emitting device is an organic light-emitting diode, or OLED for short.

The organic light-emitting device may comprise a carrier. The carrier preferably has a radiation-transmissive, in particular transparent or milky-opaque material, for example, glass. The carrier preferably consists of at least one transparent material. The carrier may take the form of a substrate suitable for application of an organic layer sequence. Furthermore, the carrier may comprise or consist of a conductive material.

An organic layer sequence may be arranged on the carrier. The organic layer sequence comprises at least one emitter layer. The at least one emitter layer contains a light-emitting material that emits light of a first wavelength range.

Typically, the organic layer sequence comprises at least two organic layers, wherein at least one of the organic layers takes the form of the emitter layer. For the purposes of this application, however, the term "organic layer sequence" is not limited to this case. Rather, the organic layer sequence may also consist of just one layer, which then forms the emitter layer. For example, the organic light-emitting device may take the form of an organic light-emitting electrochemical cell (OLEC or OLEEC), which regularly has just one organic layer.

The at least one emitter layer, for example, in each case comprises a thickness of ≥50 nm, for example, ≥100 nm, for example, ≥150 nm. Alternatively or in addition, the at least one emitter layer may have a thickness of ≤400 nm, for example, ≤300 nm, for example, ≤250 nm.

Hereinafter the at least one emitter layer is described as the emitter layer. In particular, therefore, if the emitter layer is mentioned, a plurality of emitter layers may be meant. If the layer sequence comprises at least two emitter layers, at least two individual emitter layers may, for example, connect together via at least one charge generating layer, or CGL for short. Moreover, each emitter layer may itself have a plurality of different or identical emitter layers that directly adjoin one another.

The light of the first wavelength range emitted by the emitter layer is preferably light in the visible range, for example, white, blue, green or red light. To generate light of a desired color, the emitter layer may be provided with one or more different fluorescent and/or phosphorescent emitter materials. By appropriate mixing of the emitter materials, the color location of the light emitted by the emitter layer may be adjusted. Furthermore, where present, different emitter layers may be provided with different emitter materials.

The intensity maximum of the light emitted by the emitter layer is preferably in the visible region of the electromagnetic spectrum and may have an intensity maximum at wavelengths ≥400 nm and/or at wavelengths ≤800 nm.

The organic layer sequence may comprise a plurality of further organic layers. The organic layer sequence preferably comprises at least one hole transport layer that, for example, adjoins the emitter layer. Particularly preferably, the organic layer sequence comprises at least one hole injection layer provided for effective injection of holes into the organic layer sequence. Furthermore, the organic layer sequence may comprise at least one electron transport layer and/or at least one electron injection layer.

The optional hole transport layer and the optional electron transport layer, for example, each have a thickness of ≥10 nm, for example, ≥30 nm, for example, ≥50 nm. Alternatively or in addition, the hole transport layer and the electron transport layer each have a thickness of ≤300 nm, for example, ≤200 nm, for example, ≤100 nm.

The optional hole injection layer and the optional electron injection layer, for example, each have a thickness of ≥10 nm, for example, ≥30 nm, for example, ≥50 nm. Alternatively or in addition, the hole injection layer and the electron injection layer each have a thickness of ≤150 nm, for example, ≤120 nm, for example, ≤100 nm.

Overall, the organic layer sequence has a total thickness, for example, of ≥50 nm or ≥200 nm or ≥500 nm. Alternatively or in addition, the organic layer sequence, for example, has a total thickness of ≤2000 nm, for example, ≤1000 nm, for example, ≤700 nm.

The organic light-emitting device may comprise a first electrode and a second electrode. The first electrode is configured as an anode, for example. The second electrode is configured as a cathode, for example. The anode and the cathode may electrically contact the organic layer sequence.

In particular, the organic layer sequence may be arranged between the anode and the cathode. The anode, for example, adjoins a hole injection layer of the organic layer sequence. The cathode may, for example, adjoin an electron injection layer of the organic layer sequence.

The anode and/or the cathode preferably comprise a transparent material. The anode and/or the cathode preferably consist of a material transparent to the light emitted by the emitter layer, for example, of a transparent oxide material, or TCO for short such as, for example, indium-tin oxide, or ITO for short. Furthermore, an electrode, for example, the anode or the cathode, may comprise a reflective material, for example, silver or aluminum.

The anode and the cathode each have a thickness of ≥20 nm, for example, ≥30 nm, for example, ≥50 nm. Alternatively or in addition, the anode and the cathode each have a thickness of ≤400 nm, for example, ≤300 nm, for example, ≤250 nm.

The organic light-emitting device may comprise a multiplicity of nanostructures, wherein the nanostructures have a refractive index smaller than a refractive index of the light-emitting material of the emitter layer, and wherein at least some of the nanostructures project into the emitter layer or pierce through the emitter layer. A nanostructure piercing through the emitter layer may in particular mean that the nanostructure projects through the emitter layer. In particular, the nanostructure then extends between the two surfaces that delimit the emitter layer in the vertical direction. A vertical direction means a direction perpendicular to a main plane of extension of the emitter layer and/or of the carrier. A lateral direction likewise means a direction parallel to a main plane of extension of the emitter layer and/or of the carrier.

Preferably, at least 50% of the nanostructures, particularly preferably at least 70% of the nanostructures, in particular all the nanostructures project into the emitter layer or at least 50% of the nanostructures, particularly preferably at least 70% of the nanostructures, in particular all the nanostructures pierce through the emitter layer.

The refractive index in each case means the refractive index of the material in question in the first wavelength range of the light emitted by the emitter layer. The decisive factor here is the refractive index at the first wavelength or the refractive index averaged over the entire first wavelength range.

As a result of at least some of the nanostructures projecting into the emitter layer or piercing through it and having a smaller refractive index than the light-emitting material of the emitter layer, the averaged refractive index is advantageously reduced in the region of the emitter layer and preferably in the region of the entire layer sequence. This is particularly advantageous for efficient light outcoupling from the organic layer sequence. This furthermore results in the organic light-emitting device being capable, with less input power, of delivering an identical or higher light output compared to an organic light-emitting device without such nanostructures.

The use of nanostructures has the advantage that the materials of the organic layers do not have to be modified regarding their chemical structure or be specifically selected regarding their refractive index. This is particularly advantageous since the materials used for organic semiconductors are subject to stringent requirements in terms of electrooptical characteristics and stability, and chemical modification of the materials to reduce refractive index may have undesired effects on these parameters. Moreover, nanostructures can be used with all organic functional materials, not only a specific materials class.

The structure described may advantageously be produced using a method in which first the nanostructures are formed and only in a subsequent step is the organic layer sequence produced, which may in particular contain solution-processed materials. In this way, techniques already available may be used to apply the solvent-processed materials. Since the nanostructures are not contained in the ink formulation used for this purpose, these techniques do not have to be modified accordingly, which would lead to additional costs.

The refractive index of the nanostructures may be smaller than at least one refractive index of one organic material of one of the further organic layers of the layer stack. The refractive index of the nanostructures is particularly preferably smaller than the refractive index of all the organic materials contained in the organic layer sequence. Alternatively or in addition, the refractive index of the nanostructures may be smaller than the average refractive index of all the organic materials of the organic layer sequence. The nanostructures preferably have a refractive index smaller than a refractive index of the carrier, the first electrode and/or the second electrode. The refractive index of the nanostructures is preferably ≤1.7, for example, ≤1.5, for example, ≤1.45 or 1.4 or 1.35.

The nanostructures may be in direct contact with the first electrode or with the second electrode. The nanostructures are preferably grown onto the first electrode or onto the second electrode.

The nanostructures may be of columnar configuration and extend in a vertical direction. In particular, the nanostructures take the form of nanotubes or "nanorods." The nanostructures may, for example, be cylindrical and have a substantially circular, elliptical or polygonal cross-section. Due to their growth, the nanostructures may be tapering in shape, for example, in a vertical direction away from the first or from the second electrode. The nanostructures may also extend in a direction forming a finite angle with the vertical direction.

Some or all of the nanostructures may extend in a vertical direction at least over 75% of the height of the entire organic layer sequence. For example, some or all of the nanostructures pierce through the entire organic layer sequence.

The nanostructures may have a lateral dimension, i.e., in particular a diameter in a lateral direction, of ≤200 nm, preferably ≤100 nm, particularly preferably ≤50 nm. Preferably, neighboring nanostructures are spaced in a lateral direction by ≤200 nm, preferably ≤100 nm, particularly preferably ≤50 nm.

The nanostructures may be of hollow configuration. For example, the nanostructures may comprise air inclusions or cavities filled with a gas. This has the advantage that the nanostructures may be formed from a material, for example, having a larger refractive index than the light-emitting material. Reduction of the effective refractive index is achieved by the low refractive index of the gas contained in the cavities.

The nanostructures may consist of a material at least partially transparent or absorbs only a small amount of light. For example, the nanostructures may comprise as material component $SiO_2$, $MgF_2$ or cryolite. Silicon oxide has a refractive index of n≈1.5, magnesium fluoride one of n≈1.38 and cryolite one of n≈1.34 for visible light. The refractive index of these materials is thus smaller than the typical refractive index of an organic layer of n≈1.8. In this way, the refractive index of the organic layer into which the nanostructures have been introduced may be reduced to a value that, depending on the proportion by volume of the nanostructures, lies between the refractive index of the organic material and the refractive index of the first nanostructures. A proportion by volume of the nanostructures in the organic layer sequence preferably amounts to at least 10% and at most 70%. For example, the proportion by volume of the first nanostructures in the at least one emitter layer is at least 10%, for example, ≥30%, for example, ≥50%. Alternatively or in addition, the proportion by volume of the first nanostructures in the at least one emitter layer is at most 70%, for example, ≤65%, for example, ≤60%. Preferably, the proportion by volume of the nanostructures is over 50%.

The production of nanostructures, for example, of $SiO_2$ or $MgF_2$ is known and described, for example, in Cao, M. H.; Wang, Y. H.; Qi, Y. J.; Guo, C. X.; Hu, C. W., Journal of Solid State Chemistry, 2004, 177, 2205-2209 and Zhu Guang; Zou Xiaoping; Su Yi; Cheng Jin; Wang Maofa, Journal of Physics, Conference Series 152, 2009, 012013, the disclosure of which is hereby incorporated by reference.

Alternatively, the nanostructures may have a low-refractive-index polymer as their material component. PTFE (polytetrafluoroethylene) and the derivatives thereof (n~1.3-1.4 and low absorption) and further fluorinated polymers may, for example, be used for this purpose. The use of a UV-curable polymer is advantageous.

The layer sequence may comprise a plurality of emitter layers provided to emit electromagnetic radiation and for at least some of the nanostructures to pierce through the plurality of emitter layers. A charge generation layer, or CGL for short, may be arranged between neighboring emitter layers.

The refractive index of the organic layer sequence may have a similar value to the refractive index of the first electrode and/or the second electrode and/or the carrier. The difference between the refractive index of the organic layer sequence and the refractive index of the first electrode and/or of the second electrode and/or of the carrier is preferably ≤0.1, for example, ≤0.05, for example, ≤0.01. Particularly preferably, all the organic layers have a refractive index, the value of which differs by ≤0.1, for example, ≤0.05, for example, ≤0.02 from the refractive index of the first electrode and/or of the second electrode and/or of the carrier.

The organic light-emitting device may comprise outcoupling structures. Outcoupling structures may, for example, be applied to the cathode side or to the anode side of the organic layer sequence, for example, between the anode and the organic layer sequence and/or between the cathode and the organic layer sequence. In addition, outcoupling structures may also be applied to a side of the carrier remote from the organic layer sequence.

The outcoupling structures may take the form of outcoupling films or of patterned interfaces. The outcoupling structures may preferably comprise scattering centers, at which the light emitted by the emitter layer is diffusely scattered.

Our method of producing a light-emitting device has the following method steps:

a) providing a carrier,
b) forming a first electrode on the carrier,
c) forming a multiplicity of nanostructures on the first electrode,
d) forming an organic layer sequence at least in the regions between the nanostructures, and
e) forming a second electrode on the organic layer sequence.

The statement that a layer or an element is arranged or applied "on" or "over" another layer or another element may mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other.

In the method, the nanostructures may be formed using a vapor deposition method, for example, physical vapor deposition (PVD) or chemical vapor deposition (CVD), or using a sol-gel process (in particular in the case of nanostructures of silica glass). If low-refractive-index polymers are used for the nanostructures, the material is applied flat and subsequently photolithographically patterned in particular using a photoresist. For this purpose, care must be taken to ensure clean removal of the material which is not required. In UV-curable polymers, the two-dimensional coating may also be directly photolithographically patterned, i.e., without the use of a photoresist.

In the method, the organic layer sequence may be formed in that solution-processed organic semiconductor materials are applied using a liquid phase deposition method in the regions between the nanostructures. Possible methods are, for example, slot die coating, doctor blading, spin coating, inkjet printing or spray coating.

An organic light-emitting device described here is explained in greater detail below on the basis of examples and with reference to the drawings. Elements which are the same in the individual figures are indicated with the same reference numerals. The relationships between the elements are not shown to scale, however, but rather individual elements may be shown exaggeratedly large to assist in understanding.

Figure 1:
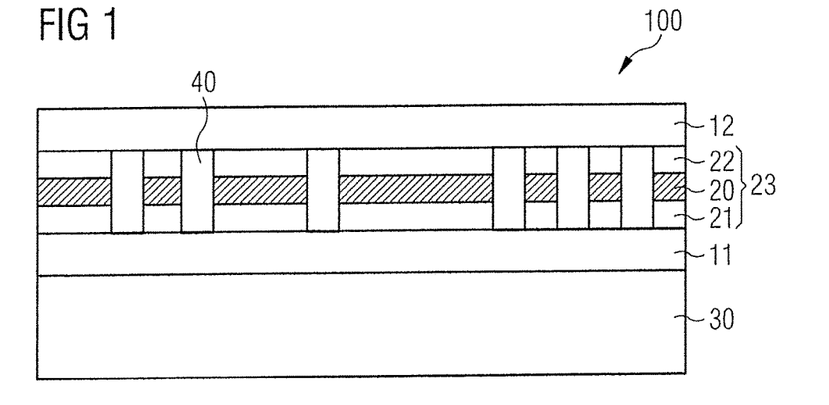
FIGS. 1 to 3 are schematic representations of examples of organic light-emitting devices.

FIG. 1 shows a sectional representation of a first example of a light-emitting organic device 100. The device 100 comprises a carrier 30 on which an anode 11 is arranged. An organic layer sequence 23 is arranged on the side of the anode 11 remote from the carrier 30. Furthermore, a cathode 12 which may, for example, be reflective is arranged downstream of the organic layer sequence 23 in the direction away from the carrier.

The carrier 30 preferably comprises a material, for example, glass which is transparent to light generated by the organic layer sequence 23.

The anode 11 preferably comprises a transparent conductive material. The anode 11 is, for example, made from indium-tin oxide, ITO for short.

In the example shown, the organic layer sequence 23 arranged on the anode 11 comprises three organic layers. The layer adjoining the anode 11 takes the form of a hole transport layer 21. The layer adjoining the cathode 12 takes the form of an electron transport layer 22.

Between the hole transport layer 21 and the electron transport layer 22, an emitter layer 20 is arranged. The emitter layer 23 may, for example, comprise fluorescent or phosphorescent emitter materials. The emitter layer may, for example, contain organic polymers, organic oligomers, organic monomers or organic small, non-polymeric molecules or a combination of these materials. The emitter materials introduced into the emitter layer 20 may be provided to generate light of different wavelengths, for example, to generate blue light or green light or red light. The emitter layer 20 may, for example, also comprise a mixture of different emitters such that the emitter layer 20 emits mixed light, for example, white light. Furthermore, the emitter layer 20 may comprise a plurality of individual emitter layers that, for example, each emit light of different colors. For example, a first emitter layer may emit red light, a second emitter layer green light and a third emitter layer blue light. The emitter layer 20, for example, has a thickness of around 200 nm.

Unlike the structure depicted in FIG. 1, the organic layer sequence 23 may also comprise further organic layers such as, for example, electron injection layers or hole injection layers.

In the example of FIG. 1, a multiplicity of nanostructures 40 pass through the organic layer stack 23, which nanostructures have a refractive index smaller than a refractive index of the light-emitting material of the emitter layer 20 and each pierce through the emitter layer 20.

The nanostructures 40 have been grown onto the anode 11 and are therefore in direct contact with the anode 11. Moreover, the nanostructures 40 are of columnar configuration and extend in a vertical direction, wherein they pierce through the entire organic layer sequence 23. In the example of FIG. 1, the nanostructures 40 are arranged irregularly. However, they may also be arranged regularly, for example, in a two-dimensional grid.

In the example described, the nanostructures 40 are cylindrical in shape, with a substantially circular cross-section with a diameter of less than 200 nm, and consist of a transparent material such as, for example, quartz.

Figure 2:
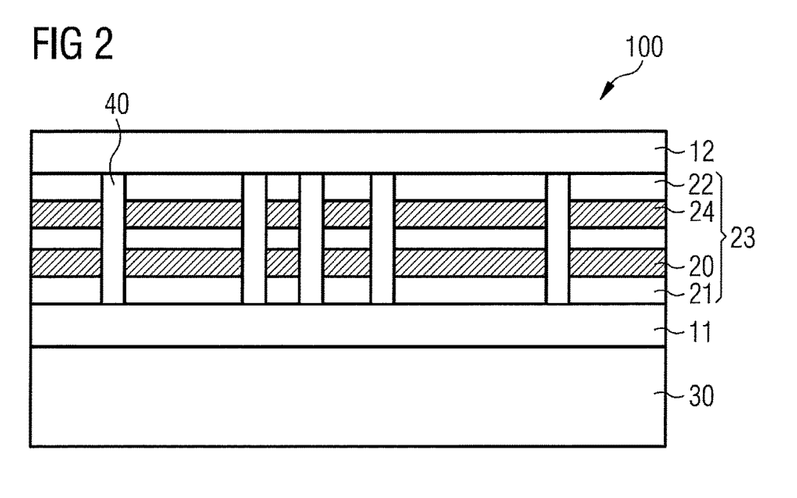

FIG. 2 shows a further example of a light-emitting organic device 100. Unlike the structure shown in FIG. 1, the organic layer sequence 23 comprises two emitter layers 20, 24, each provided to emit electromagnetic radiation. The nanostructures 40 pierce through both emitter layers 20, 24 and so ensure a reduction in the refractive index in both layers.

Figure 3:
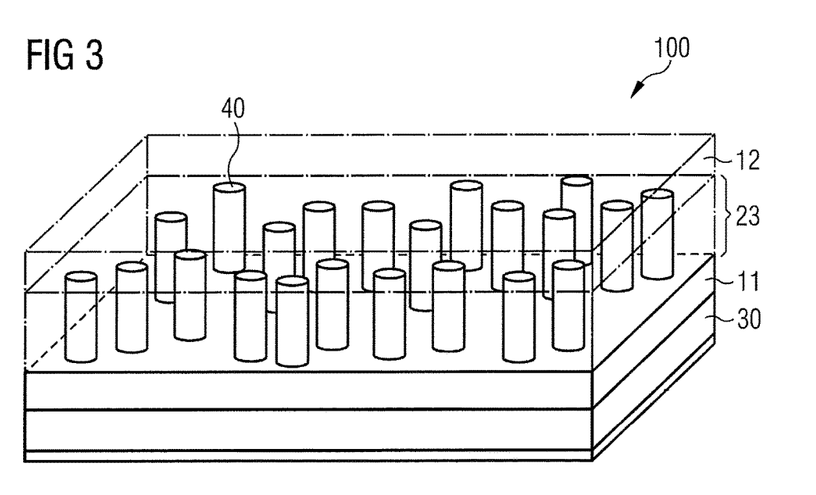

FIG. 3 is a perspective view of the light-emitting organic device 100 in which the layer structure of the organic layer stack 23 is not shown in detail. In this example too, the nanostructures 40 are irregularly arranged. A proportion by volume of the nanostructures 40 in the organic layer sequence 23 amounts to at least 10% and at most 70%. On the side of the carrier 30 remote from the organic layer sequence 23, an outcoupling layer in the form of a film is arranged.

FIGS. 4 to 8 show an example of a method of producing an organic light-emitting device by intermediate steps shown in schematic sectional view.

Figure 4:
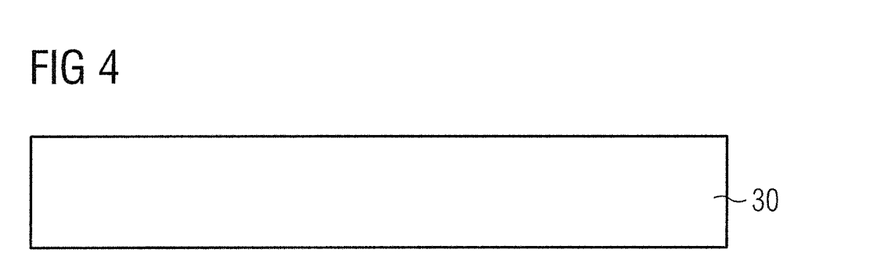
FIGS. 4 to 8 shown an example of a method of producing an organic light-emitting device on the basis of intermediate steps each shown in schematic sectional view.
Figure 5:
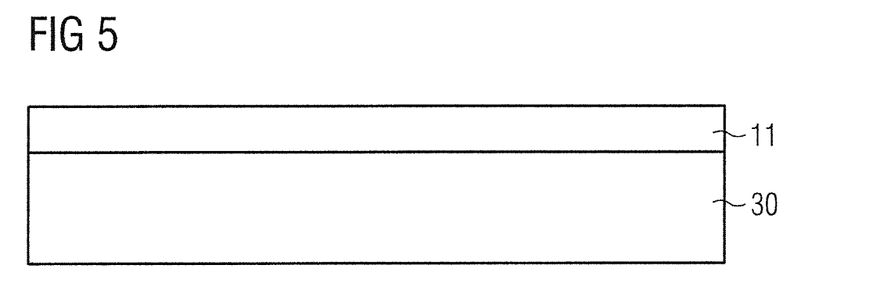

In the method step depicted in FIG. 4, a carrier 30 is provided. Then a transparent anode 11 is formed on the carrier 30 (FIG. 5).

Figure 6:
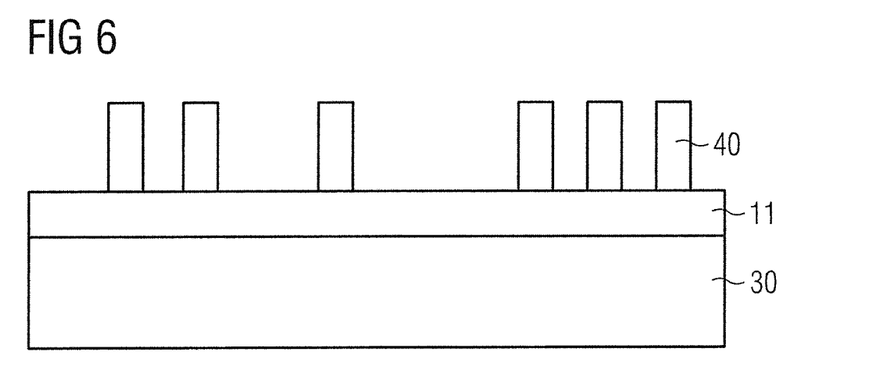

In the method step depicted in FIG. 6, a multiplicity of nanostructures 40 are formed on the transparent anode 11, in particular using a vapor deposition method, for example, physical vapor deposition (PVD) or chemical vapor deposition (CVD), or using a sol-gel process (in particular in the case of nanostructures of silica glass). If low-refractive-index polymers are used for the nanostructures, the material is applied flat and subsequently photolithographically patterned in particular using a photoresist.

Figure 7:
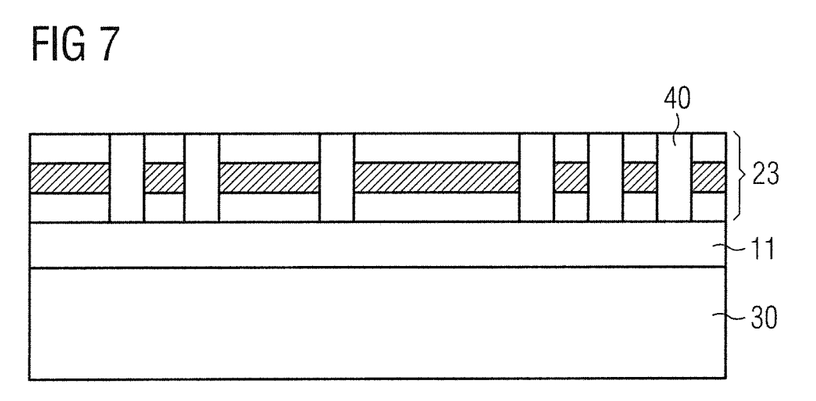

In the method step depicted in FIG. 7, an organic layer sequence 23 is formed at least in the regions between the nanostructures 40 by applying solution-processed organic semiconductor materials using a liquid-phase deposition method in the regions between the nanostructures, i.e., solvent-based processes are used. Possible methods are, for example, slot die coating, doctor blading, spin coating, inkjet printing or spray coating.

Figure 8:
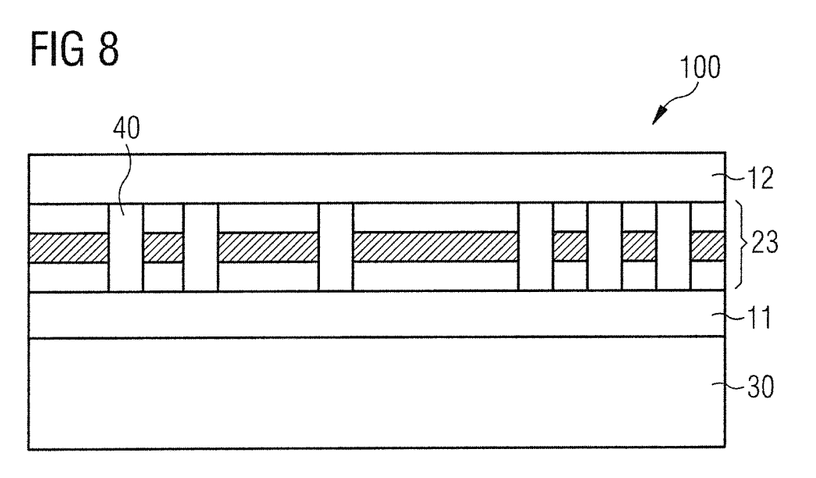

In a final example depicted in FIG. 8, a cathode 12 is formed on the organic layer sequence 23.

Our components and methods described here are not restricted by the description given with reference to the examples. Rather, this disclosure encompasses any novel feature and any combination of features, including in particular any combination of features in the appended claims, even if the feature or combination is not itself explicitly listed in the claims or examples.

This application claims priority of DE 10 2014 111 424.8, the subject matter of which is hereby incorporated by reference.

The invention claimed is:

1. A light-emitting device comprising:
   a carrier,
   an organic layer sequence arranged on the carrier and having at least one emitter layer containing a light-emitting material configured to emit light of a first wavelength range,
   a first electrode and a second electrode, and
   a multiplicity of nanostructures, wherein the nanostructures have a refractive index smaller than a refractive index of the light-emitting material of the emitter layer and at least some of the nanostructures project into the emitter layer or pierce through the emitter layer.

2. The device according to claim 1, wherein the nanostructures are in direct contact with the first electrode or with the second electrode.

3. The device according to claim 1, wherein the nanostructures have been grown onto the first electrode or onto the second electrode.

4. The device according to claim 1, wherein the nanostructures are of columnar configuration and extend in a vertical direction.

5. The device according to claim 1, wherein the nanostructures extend in a vertical direction at least over 75% of a height of the entire organic layer sequence.

6. The device according to claim 1, wherein at least some of the nanostructures pierce through the entire organic layer sequence.

7. The device according to claim 1, wherein the nanostructures have a lateral dimension of less than 200 nm.

8. The device according to claim 1, wherein the nanostructures are of hollow configuration.

9. The device according to claim 1, wherein the nanostructures consist of a transparent material.

10. The device according to claim 1, wherein the nanostructures comprise as material component $SiO_2$, $MgF_2$, cryolite, a polymer or a fluorinated polymer.

11. The device according to claim 1, wherein a proportion by volume of the nanostructures in the organic layer sequence is at least 10% and at most 70%.

12. The device according to claim 1, wherein the nanostructures have a refractive index smaller than a refractive index of the carrier, the first electrode or the second electrode.

13. The device according to claim 1, wherein the layer sequence comprises at least two organic layers and at least one of the organic layers forms the emitter layer.

14. The device according to claim 13, wherein the layer sequence comprises a plurality of emitter layers that emit electromagnetic radiation, and each of the nanostructures pierces through the plurality of emitter layers.

15. A method of producing a light-emitting device, the device comprising:
a carrier,
an organic layer sequence arranged on the carrier and having at least one emitter layer containing a light-emitting material configured to emit light of a first wavelength range,
a first electrode and a second electrode, and
a multiplicity of nanostructures, wherein the nanostructures have a refractive index smaller than a refractive index of the light-emitting material of the emitter layer and at least some of the nanostructures project into the emitter layer or pierce through the emitter layer, the method comprising:
a) providing the carrier,
b) forming the first electrode on the carrier,
c) forming the multiplicity of nanostructures on the first electrode,
d) forming the organic layer sequence at least in the regions between the nanostructures, and
e) forming the second electrode on the organic layer sequence.

* * * * *